(12) United States Patent
Hsu

(10) Patent No.: US 7,755,048 B2
(45) Date of Patent: Jul. 13, 2010

(54) LARGE FORMAT THERMOELECTRIC INFRARED DETECTOR AND METHOD OF FABRICATION

(76) Inventor: Ying Hsu, 3001 Redhill Ave., Bldg 4/108, Costa Mesa, CA (US) 92626

( * ) Notice: Subject to any disclaimer, the term of this patent is extended or adjusted under 35 U.S.C. 154(b) by 371 days.

(21) Appl. No.: 11/807,671

(22) Filed: May 30, 2007

(65) Prior Publication Data

US 2010/0031992 A1 Feb. 11, 2010

Related U.S. Application Data

(60) Provisional application No. 60/809,466, filed on May 30, 2006.

(51) Int. Cl.
*G01J 5/16* (2006.01)
(52) U.S. Cl. .................................................. 250/338.1
(58) Field of Classification Search ................ 250/338.1
See application file for complete search history.

(56) References Cited

U.S. PATENT DOCUMENTS

| | | | | |
|---|---|---|---|---|
| 5,656,816 A | * | 8/1997 | Tanaka | 250/339.01 |
| 5,914,488 A | * | 6/1999 | Sone | 250/338.1 |
| 6,046,398 A | | 4/2000 | Foote et al. | |
| 6,089,089 A | | 7/2000 | Hsu | |
| 6,316,770 B1 | * | 11/2001 | Ouvrier-Buffet et al. | 250/338.1 |
| 6,578,420 B1 | | 6/2003 | Hsu | |
| 6,715,352 B2 | | 4/2004 | Tracy | |
| 6,891,160 B2 | | 5/2005 | Kaufman | |

FOREIGN PATENT DOCUMENTS

JP 08304174 A * 11/1996

OTHER PUBLICATIONS

Foote et al., Uncooled Thermopile Infrared Detector Linear Arrays with Detectivity Greater than $10^9$ cmHz$^{1/2}$/W, *IEEE Transactions on Electron Devices*, 45(9) (1998).
Foote, M.C, Temperature Stabilization Requirements for unchopped thermal detectors, *Proceedings of SPIE*, 3698:344-350 (1999).
Foote et al., Thermopile Detector Arrays for Space Science Applications, NSA Workshop on Thermal Detectors for Space, Jun. 19-20, 2003, Washington, D.C.

(Continued)

*Primary Examiner*—David P Porta
*Assistant Examiner*—Shun Lee

(57) ABSTRACT

The thermoelectric detector consists of an absorber structure supported by two electrically connected beams made of thermoelectric materials such as polysilicon, polysilicon/germanium, bismuth-telluride, skutterrides, superlattice structures, nano-composites and other materials. One end of the thermoelectric beam connects to the absorber structure; the other end connects to the substrate. Infrared radiation incident on the absorber heats up the absorber, resulting in a temperature gradient along the length of the thermoelectric legs, and generating an electrical voltage. The detector arrays are fabricated using micromachining process. The absorber structure is formed over a sacrificial material that is removed at the end of the processing, leaving the detector suspended and thermally isolated. The sacrificial processing method enables the production of small pixel thermoelectric detectors in large two-dimensional arrays with high sensitivity.

31 Claims, 3 Drawing Sheets

OTHER PUBLICATIONS

Muller et al., A novel micromachined 2x128 linear thermoelectric infrared radiation sensor array, *Proceedings of MICROTEC* 2000, 1:465-469 (2000).

Schimert et al., Low cost, Low Power Uncooled a-Si-based Micro Infrared Camera, *Proceedings of SPIE*, 3577:96-105 (1999).

Schimert et al., Low cost, Low Power Uncooled 120x160 a-Si-based Micro Infrared Camera for Law Enforcement Applications, *Proceedings of SPIE*, 4232:187-194 (2001).

Kruse, Paul W., "Uncooled Thermal Imaging Arrays, Systems, and Applications", Tutorial Texts in Optical Engineering vol. TT51, published Jul. 15, 2001.

* cited by examiner

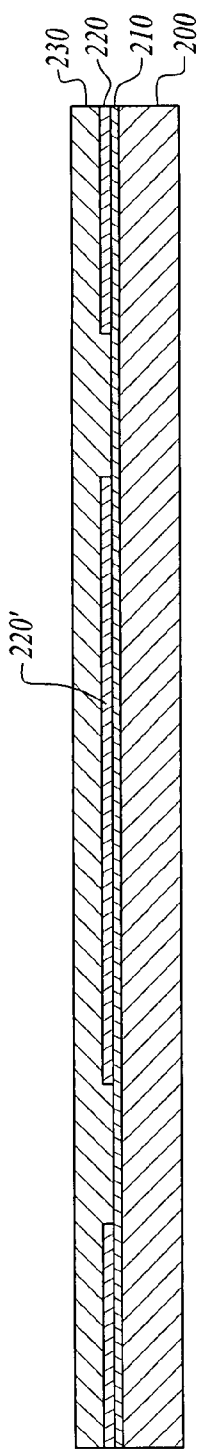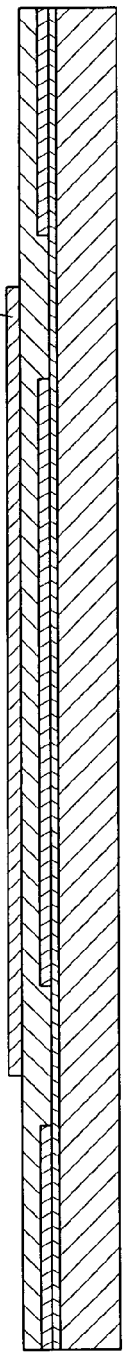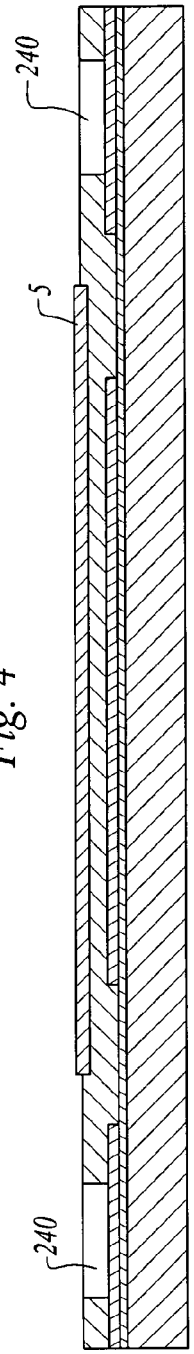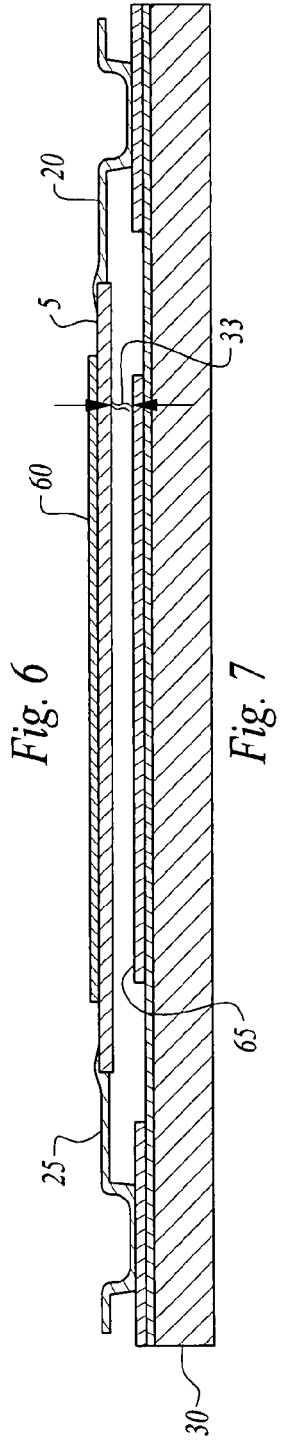
Fig. 3
Fig. 4
Fig. 5
Fig. 6
Fig. 7

LARGE FORMAT THERMOELECTRIC INFRARED DETECTOR AND METHOD OF FABRICATION

CROSS-REFERENCE TO RELATED APPLICATIONS

This application claims the benefit of U.S. Provisional Patent Application 60/809,466, filed on May 30, 2006, entitled "Large Format Thermoelectric Infrared Detector and Method for Fabrication" pursuant to 35 USC 119, which provisional application is incorporated fully herein by reference.

STATEMENT REGARDING FEDERALLY SPONSORED RESEARCH AND DEVELOPMENT

Not applicable.

DESCRIPTION

1. Field of the Invention

The invention relates to the field of infrared detectors and a method of their fabrication. Specifically, the invention relates to the use of thermoelectric sensors for the observation of temperature differences in a scene.

2. Background of the Invention

Detection of infrared signals is primarily achieved by the use of either photon detectors or thermal detectors.

Photon detectors depend upon the absorption of photons from an observed scene to break electrons or holes free on the selected detector material. Depending on the selected material, the absorption of photons results in a change the electrical conductivity of the material or in a voltage being generated by the detector.

Thermal detectors on the other hand, depend upon absorbing incident infrared radiation (IR) from the observed scene, resulting in a change in the temperature of the detector. This in turn results in a change in electrical resistivity or electrical polarization in the detector material or in a voltage being generated by the detector.

Photon detectors generally have a relatively high sensitivity and fast response time, but operate over a relatively narrow band of electromagnetic spectrum. Additionally, photon detectors undesirably require cooling to cryogenic temperatures, typically 77K (−321 F) or below.

Thermal detectors have somewhat lower sensitivity and slower response time than photon detectors, but can operate over a broader IR spectrum and without the need for cryogenic cooling.

All infrared detectors are fundamentally limited by both the temperature of the detector itself as well as by the temperature of the background in which the object of interest resides. For applications where the background temperature is approximately room temperature, it has been shown that cryogenic cooling of photon detectors does not significantly increase sensor sensitivity. For example, cooling a photon detector to 77K (−321 F) yields a maximum theoretical Detectivity (referred to as D*) value of $2.3 \times 10^{10}$ cm-$\sqrt{Hz}$/Watt, while operating the detector at 290K (62 F) yields a D* value of $1.8 \times 10^{10}$ cm-$\sqrt{Hz}$/Watt. The slight enhanced sensitivity with cryogenic cooling however, significantly increases the cost and decreases the reliability of the overall system.

Uncooled infrared detection systems are preferred owing to their smaller size and power consumption and have a broad range of applications in both the military and civilian fields. Military applications include infrared systems for surveillance in low light, no light, foggy or dusty conditions. Examples include night vision systems, weapon sights, unmanned autonomous vehicles, or networked surveillance systems.

In civilian applications, uncooled infrared detection systems are beneficially used in firefighting, security, building maintenance, and medical diagnostics. The development of uncooled detectors has resulted in smaller and more affordable systems for use in the above and other fields.

While system cost is a significant consideration in the above applications, overall power consumption of an infrared imaging system is also critical, particularly for mobile applications. Batteries are inefficient, heavy, and greatly limit the life of portable infrared imaging systems. A significant source of power consumption is the cooler necessary to stabilize the temperature of the detectors in a cooled system. Without thermal stabilization, the calibration parameters of the detector drift due to changes in the environment temperature.

Development of infrared detection systems without thermal stabilization have been demonstrated successfully, such as disclosed in U.S. Pat. No. 6,891,160, "Method And Apparatus For Temperature Compensation Of An Uncooled Focal Plane Array" assigned to assignee herein, Irvine Sensors Corp. In such systems, temperature calibrated parameters (e.g., gain, offset, or bias) are stored in memory and the system electronics selects the appropriate calibration parameters by measuring detector temperature in real time. However, to achieve high performance, every pixel in the thermal detector array must be calibrated over a wide range of temperatures and in very small increments of temperature. Undesirably, the temperature calibration process is time consuming and labor intensive, thus adding cost. Additionally, real time temperature compensation requires processing power, which further reduces battery life.

The ideal requirements of an infrared detection system for mobile applications would be low cost, low power consumption, and low sensitivity to environmental temperature change. Among the different types of thermal detectors available to address these requirements, i.e., micro-bolometers, ferro-electric detectors and thermodetector/thermopiles, the thermopile approach is well-suited.

Thermopiles are differential sensors and require two orders of magnitude lower thermal stabilization than micro-bolometers. Additionally, thermopiles are highly linear and have a wide dynamic range. Thermopiles also self-generate a voltage (i.e., no biasing voltage required and no voltage pedestal required), and have lower intrinsic noise than micro-bolometers. These characteristics make thermopiles an ideal candidate for mobile infrared sensor applications.

Processes for manufacturing micro-electronic machined systems (MEMS) and devices are well-suited toward fabrication of very small, high tolerance assemblies such as are required for detector-level thermopile assemblies. Examples of MEMS devices are disclosed in U.S. Pat. No. 6,715,352, "Method of Designing a Flexure System for Tuning the Modal Response of a Decoupled Micromachined Gyroscope and a Gyroscope Designed According to the Method", to Tracy; U.S. Pat. No. 6,089,089, "Multi-Element Micro Gyro", to Hsu; and U.S. Pat. No. 6,578,420, "Multi-Axis Micro-Gyro Structure", to Hsu, all assigned to Irvine Sensors Corp., assignee herein, and the entirety of each of which is fully incorporated by reference herein.

Although silicon-based, micro-machined thermopiles have been in development since the mid-1980's, thermopile assemblies developed to date consist of large detector pixels with only modest sensitivity. The challenge for thermopile development is to create two-dimensional, large format arrays such as 320×240 or larger with high sensitivity for thermal imaging applications. Large format arrays require the detector size be 50 μm or smaller in order to yield significant number of arrays from each wafer. High sensitivity, or D* values, typically greater than $1.0 \times 10^9$ cm-$\sqrt{Hz}$/Watt, are also necessary for high resolution thermal imaging.

One example of a MEMS thermodetector array approach is disclosed in U.S. Pat. No. 6,046,398, to Foote, et al., which patent is fully incorporated by reference herein. Foote, et al. describes a micro-machined, one-dimensional thermoelectric sensor array and method of fabrication. Foote utilized a Bismuth-Telluride system as the thermoelectric material and demonstrated detectors with properties ranging from a D* of $1.4 \times 10^9$ cm-$\sqrt{Hz}$/Watt and 99 ms response time for 1,500 μm×71 μm detectors to a D* of $0.97 \times 10^9$ cm-$\sqrt{Hz}$/Watt and 15 ms response time for 70 μm×50 μm detectors. The detector structure of Foote is generally comprised of thermoelectric legs encapsulated between two solid layers of silicon nitride and having a window opening etched through the substrate for the receipt of incident IR energy from a scene.

Since the performance of an infrared detector depends on how well the detector structure is thermally isolated, the dielectric silicon nitride material under the thermoelectric material has the undesirable attribute of permitting heat transfer/leakage which reduces detector thermal isolation. Although Foote identified the heat loss due of the dielectric support layers as contributing to lower sensitivity, no alternate detector design or method of fabrication is suggested.

The opening in the silicon substrate underneath the IR absorber of Foote is also a factor that ultimately limits the size of the detector that may be produced. Since the IR opening must be etched through the thickness of the substrate, the size of the opening is limited by the etch process and by the ratio of the opening-to-substrate thickness. For large detector arrays with small pixels, etching high aspect ratio holes becomes a difficult manufacturing process and results in an array that is structurally weak.

A new design approach and fabrication solution is needed to achieve higher performance in thermoelectric detectors. The claimed invention overcomes the above limitations and enables the production of thermoelectric detector arrays with small size, high sensitivity, robust structure, and ease of fabrication.

SUMMARY OF THE INVENTION

In a first embodiment of the invention, an infrared detector comprises an infrared absorbing plate structure suspended over a substrate by an air gap comprising an offset distance and supported by a first thermoelectric conductor and a second thermoelectric conductor, each comprised of a thermoelectric material. The offset distance between the plate structure and substrate preferably defines an optical resonant cavity. The terminal ends of the respective thermoelectric structures are each connected to the plate structure at a hot junction and to the substrate at a cold junction. The thermoelectric conductors preferably have a relatively small cross-section area (smaller than 1 μm per side), and are comprised of materials with thermoelectric properties such that when the respective hot junctions are electrically connected and a temperature differential exists between them, an electrical voltage is generated.

An electrical connection between the respective hot junctions is made, such as by using a plate structure material that is electrically conductive or by disposing a conductive trace upon the plate structure that connects the respective hot junctions. An infrared absorbing material is preferably deposited over the upper major surface of the plate structure to enhance the plate structure's IR absorbing ability. An optically reflective layer is preferably provided on the upper surface of the substrate to enhance absorption of the infrared radiation into the plate structure from below. The reflective layer is positioned at a predetermined, fixed distance from the lower major surface of the plate structure to define an optical resonant cavity to enhance energy absorption by the plate structure.

In a second aspect of the invention, a method of fabricating the detector is disclosed. A passivation layer is deposited on a substrate and patterned to make openings or vias for electrical contacts with the substrate. An electrically conductive layer is deposited over the patterned passivation layer and the vias. The conductive layer is patterned to both produce a reflective surface and predefined interconnection traces.

A sacrificial material is deposited over the patterned conductive layer. A plate structure support material is deposited over the sacrificial layer. The plate structure support is etched to define the final plate structure. The sacrificial layer is then opened to provide access to the electrically conductive layer.

Two thermoelectric materials with different electron and hole densities are deposited and patterned leaving first and second thermoelectric structures that make contact with the plate structures on one end and with the electrically conductive traces under the sacrificial layer on the other end. An infrared absorbing material is deposited and patterned over the plate structure. The sacrificial layer is removed by etching or by sublimation, leaving the plate structure suspended over the substrate at a predefined offset distance and supported by the first and second thermoelectric structures.

Examples of passivation layer material are silicon oxide and silicon nitride. The electrically conductive material may be polysilicon, gold or aluminum. The sacrificial material may be a nitride, polyimide and other equivalent material.

The thermoelectric structures may desirably be fabricated of semiconductor material systems such as bismuth-telluride, antimony-telluride, lead telluride, polysilicon, germanium, or specially engineered compounds such as skutterrudites, nano-composites and super-lattices.

The plate structure material may be comprised of silicon oxide, silicon nitride, or of preselected thermoelectric materials. The infrared absorbing material may be comprised of platinum or other material with low infrared transmission.

In a third aspect of the invention, the substrate further comprises prefabricated active integrated circuitry for the processing of the detector output signals. The thermoelectric structures supporting the plate structures are connected to defined input pads on the prefabricated integrated circuits.

In a fourth aspect of the invention, the completed substrate with a detector array is bonded to a capping substrate (i.e., capping wafer) to provide environmental protection for the detectors. The capping substrate defines a cavity over the detectors. Air and other gases in the cavity are evacuated to create a vacuum environment. The cavity above the detectors provides a window that admits infrared radiation to the plate structure with minimum attenuation or interference. Examples of the capping substrate material are, for instance silicon or germanium materials.

BRIEF DESCRIPTION OF THE DRAWINGS

FIGS. 3-7 illustrate process steps of the fabrication of a MEMS embodiment of the detector of the invention.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Figure 1:
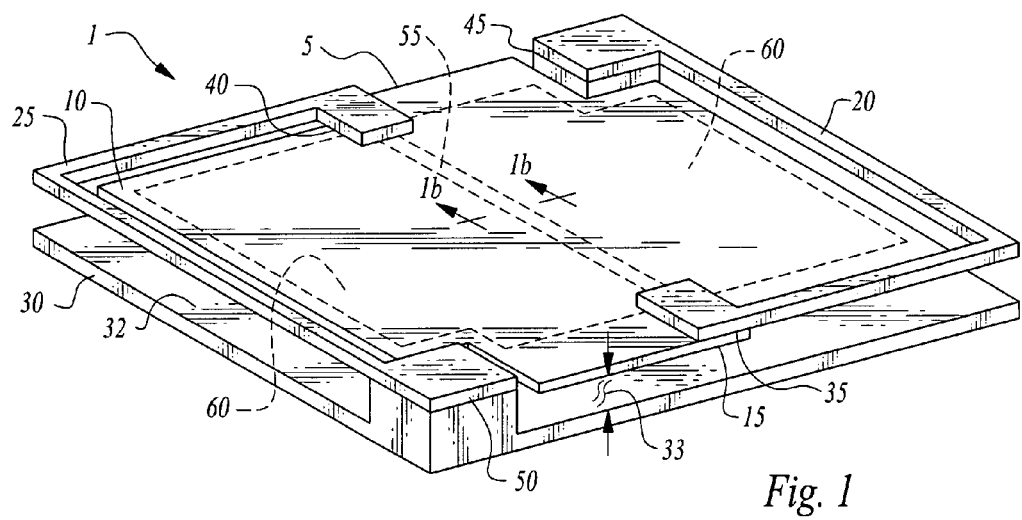
FIG. 1 is a perspective view of the detector of the invention.
Figure 1A:
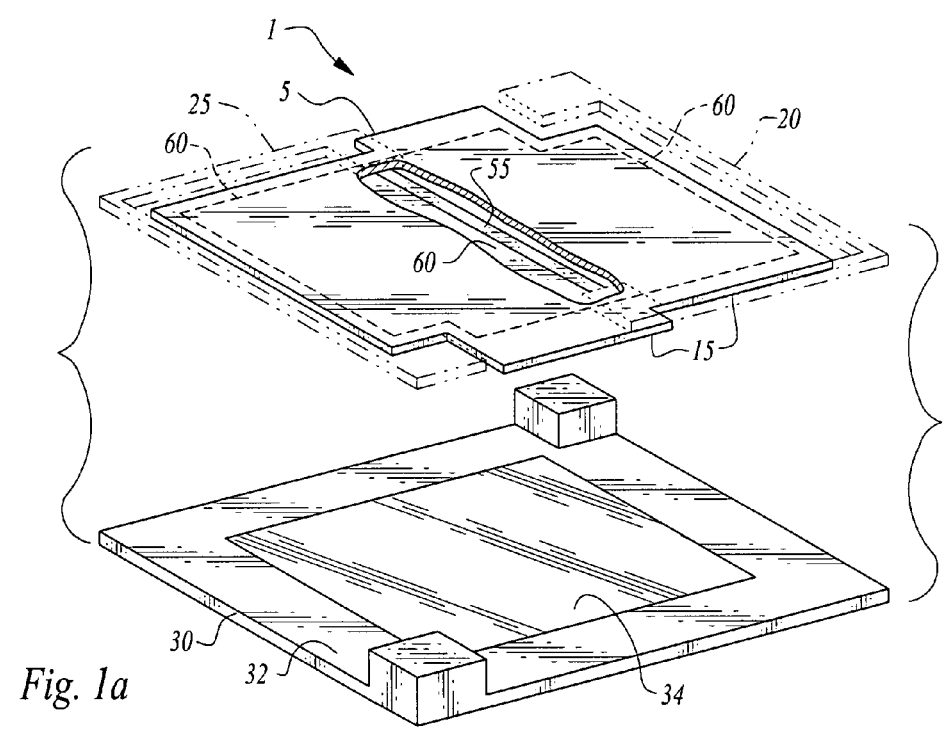
FIG. 1a is an exploded perspective view of the detector of the invention.

Turning now to the figures wherein like numerals define like elements among the several views, FIGS. 1 and 1a illustrate a preferred embodiment of detector 1 of the invention.

Detector 1 comprises a plate structure 5 comprising an upper major plate surface 10 and a lower major plate surface 15. Plate structure 5 functions as an infrared radiation collector of IR energy incident upon upper major plate surface 10.

Plate structure 5 is supported by at least two thermoelectric structures referred to as first thermoelectric structure 20 and second thermoelectric structure 25. First and second thermoelectric structures are preferably elongate, narrow beams or legs comprising one or more thermoelectric materials such as Bismuth-Telluride, Bismuth-Antimony-Telluride, polysilicon, polysilicon/germanium or equivalent materials.

Plate structure 5 is suspended above a substrate 30 by means of the thermoelectric structures so as to define a hollow volume and an offset distance between plate structure 5 and substrate 30 to provide thermal isolation of plate structure 5 from the remaining detector elements. Substrate 30 comprises an upper major substrate surface 32. As discussed further below, the hollow volume, referred to as an offset distance 33 herein, generally comprises a spaced-apart distance between the substantially parallel lower major plate surface 10 and upper major substrate surface 32. Offset distance 33 preferably comprises about 0.25 of the wavelength of a preselected optical wavelength so as to function as a resonant cavity to enhance the sensitivity of the detector. To further optimize the sensitivity of the detector, an IR reflective surface 34 is preferably disposed upon upper major substrate surface 32 for the reflection of IR radiated from plate structure 5 back into plate structure 5.

One end portion of first thermoelectric structure 20 is in connection with plate structure 5 at first hot junction 35. One end portion of second thermoelectric structure 25 is in connection with plate structure 5 at second hot junction 40. The respective opposing ends of first and thermoelectric structures are in connection with substrate 30 at first cold junction 45 and second cold junction 50 respectively.

In the illustrated embodiment, first hot junction 35 and second hot junction 40 are in electrical connection by means of an electrically conductive structure 55, which may, for instance comprise a metal trace or which may comprise an electrically conductive plate structure 5 or other equivalent means.

As illustrated in FIGS. 1 and 1a, selected portions of first and second thermoelectric structures are preferably horizontally offset from plate structure 5 for thermal isolation from plate structure 5.

When incident IR heats plate structure 5, detector 1 generates an output voltage that is proportional to the temperature difference between the plate structure 5 and substrate 30, thus providing a voltage signal whose amplitude is proportional to the intensity of infrared radiation incident upon detector 1.

To beneficially increase the IR sensitivity of the detector, an IR absorbent material 60 such as platinum, IR collecting nanostructure material, IR absorbing dyes or other equivalent means is preferably disposed upon upper major plate surface 10.

Figure 1B:
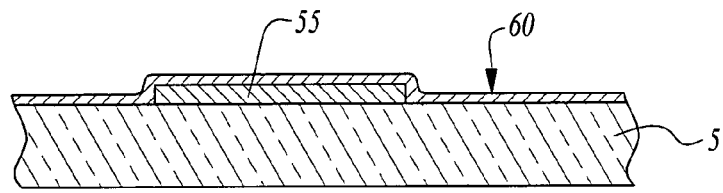
FIG. 1b is a cross-section of FIG. 1 taken along 1b-1b.

As best seen in FIG. 1b, an exemplar cross-section of plate structure 5 comprises IR absorbent material 60 and electrically conductive structure 55, in this instance, a conductive trace.

When the detector is disposed within a vacuum environment, a substantial portion of the IR absorbed by the detector will pass from plate structure 5 and through (rather than radiate from) the pair of thermoelectric structures, resulting in a temperature gradient across them. In turn, the thermoelectric structures generate a voltage that is linearly proportional to the temperature gradient across them.

Figure 2:
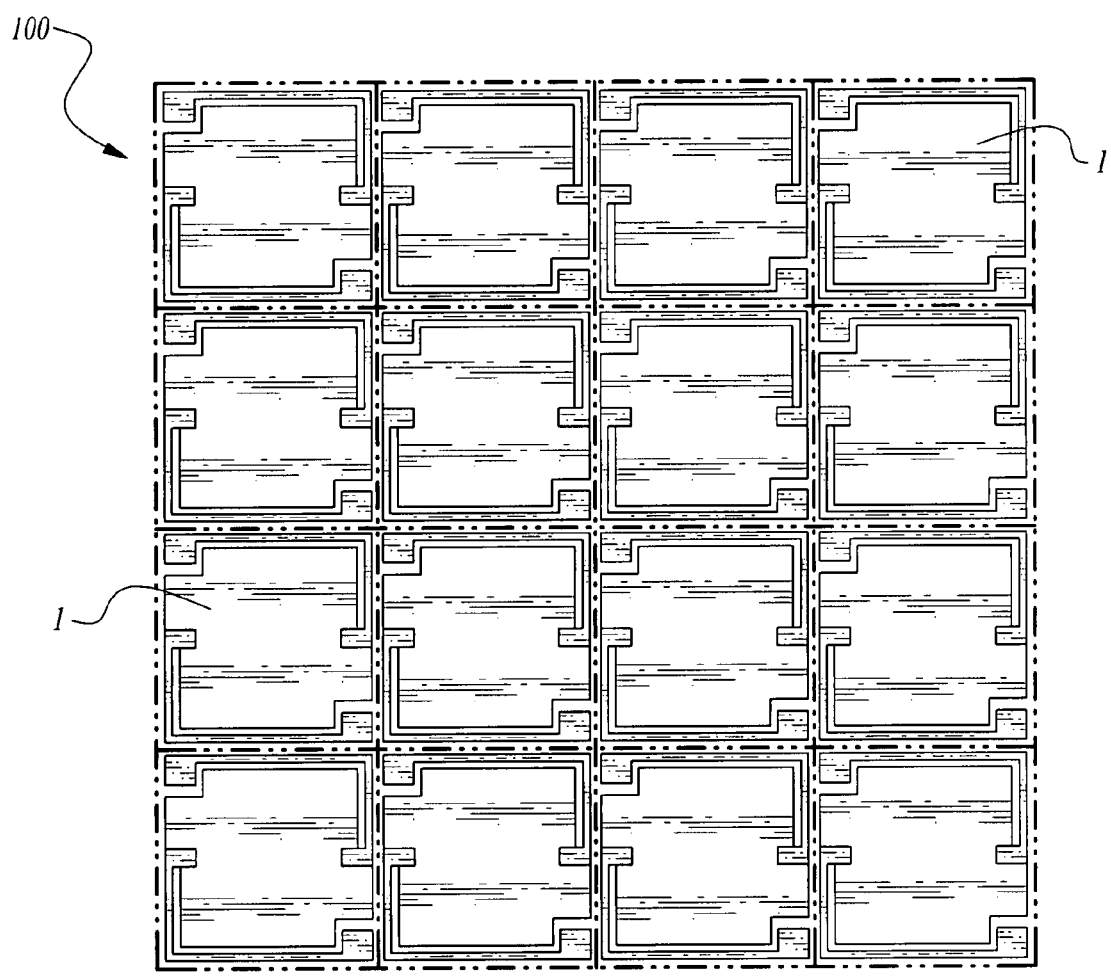
FIG. 2 is a plan view of a 4×4 array of the detectors of the invention.

FIG. 2 illustrates a plan view of a 4×4 detector array 100 of the detectors 1 of the invention.

Achieving the optimum design of the thermoelectric detectors of the invention depends in part on the thermal isolation design of the device. To increase the sensitivity of detector 1, plate structure 5 is desirably thermally isolated as much as possible. In a preferred embodiment, very low thermal conductance of about 10 nW/K is achievable with a pair of thermoelectric structures having dimensions of approximately 35 microns in length, 0.5 microns in width and 0.25 microns in thickness. Low thermal conductance affects several parameters that represent key figures of merit for IR detection. These parameters include thermal response time, responsivity, Noise Equivalent Power (NEP), and D*.

The thermal response time measures how quickly the detector reacts to changing scene temperatures. For thermal imaging applications, the thermal time constant is preferably near or less than 10 msec. The time constant is the ratio of the thermal mass to thermal conductance (both through the thermoelectric structures and by radiation). Hence, for low response time, the thermal mass of plate structure 5 should be minimized in proportion to the thermal conductance. Proper selection of plate structure material and thickness will minimize thermal mass as is known to those skilled in the mechanical arts. For a plate structure fabricated from low thermal conductance materials (e.g., Bismuth-Telluride) with size of 35×35 microns and thickness of 0.25 microns, the estimated response time is less than 2 ms.

The Responsivity of a thermoelectric detector represents the voltage generated as a result of incident IR. To maximize the detector output voltage, thermoelectric materials with relatively high Seebeck coefficients are preferred. Many metals and semiconductors exhibit a moderate level of Seebeck constant, with highest performance being Bismuth-based thermoelectric materials. Similarly, to maximize the conversion of incident electromagnetic radiation into thermal energy, the detector should have largest possible active area (i.e., a high fill factor), high thermal absorptivity, and low thermal conductance. Active detector area and thermal conductance are each limited by desired pixel size, which should be as small as possible to obtain large format arrays and to produce as many chips as possible from a given wafer. An IR absorbing material may be applied on the upper plate surface with the caveat that conventional IR absorbers require a relatively thick coating to efficiently absorb IR energy. Since it is imperative in designing the detector to keep the thermal mass as small as possible, a relatively large thickness of conventional IR coating is not desirable.

To ensure high IR absorption, an embodiment using a "quarter wave resonant cavity" is provided. The resonant cavity structure generally comprises positioning a reflective layer 34 upon the upper major surface of substrate 30 to reflect transmitted IR energy to plate structure 5. With proper offset distance spacing between substrate 30 and plate structure 5, a resonant offset distance 33 is provided and the transmitted radiation will be reflected multiple times, thereby maximizing the IR absorption by plate structure 5. In an exemplar embodiment, an offset distance is expected to be approximately 2 microns for optimum absorption of electromagnetic energy between 8 to 14 μm, yielding as high as 80% IR absorptivity.

The Noise Equivalent Power (NEP) is a measure of noise in the detector represented in the form of incident radiation energy. To achieve the highest detector sensitivity, the NEP is preferably as small as possible. Major noise sources are Johnson noise, thermal fluctuation noise, and to a lesser degree, background thermal noise. Johnson noise is generally a function of operating temperature, bandwidth and electrical resistance. High efficiency thermoelectric materials such as Bismuth-based thermoelectric systems have relatively low electrical resistivity (<10 micro ohm-m) and will yield low electrical impedance of typically several kilo-ohms. The temperature fluctuation noise is due to phonon exchange through the thermoelectric structures, and depends on the degree of thermal isolation of the detector elements.

By way of example and not by limitation, performance characteristics of a preferred embodiment of the detector of the invention are provided. The main assumptions made for the preferred embodiment are:

Achievable thermoelectric material properties:
Seebeck Coefficient (S)=300 e-6 V/K
Thermal Conductivity (λ)=2 W/m-K
Electrical Volume Resistivity (Rv)=10e-6 Ohm-m
Thermoelectric leg geometry:
  Width (w)=0.5 μm
  Thickness (t)=0.25 μm
  Length (l)=35 μm
  Number of legs (n)=2

The conductance (Gleg) of the thermoelectric structures is estimated to be 1.4e-8 W/K and the thermal conductance due to radiation is estimated to be 3.8e-9 W/K. The total conductance is therefore 1.8e-8 W/K.

The Johnson noise is estimated using the following equation:

$$Vj = (4kTBwR)^{1/2}$$

The Temperature Fluctuation noise is estimated based on the following equation:

$$Vtf = 2k B^{1/2} STBw^{1/2}/Gleg s^{1/2}$$

Finally, the background Noise is estimated based on the following equation:

$$Vbg = A^{1/2} Rs Bw^{1/2}/D^*, \text{ where } D^* \text{ is the background limited } D^* \text{ at 300K.}$$

In these equations, k is the Boltzman's constant, Bw is bandwidth, R is resistivity, A is pixel area, G is conductance, and Rs is Responsivity.

The Responsivity, Rs, is defined as: Rs=S/G, where S is the Seebeck constant.

Lastly, the Noise Equivalent Power, NEP, is defined as: NEP=Vt/Rs, where Vt is the total noise.

Using the relationships given above, a preliminary calculation is as follows. The estimated Johnson noise is the largest at approximately 53 nV, followed by 32 nV and 15 nV for thermal fluctuation and thermal background noise, respectively. The total combined noise is expected to be approximately 64 nV, or, converted into incident power, results in NEP of approximately 4 pico watt. This low NEP represents the detector operating at room temperature, yet is comparable to some HgCdTe sensors operating at cryogenic temperatures.

The following parameters and target values illustrate projected performance of the above preferred embodiment of the detector of the invention.

| Parameter | Target Value |
|---|---|
| Pixel size (μm) | 35 × 35 |
| Resistance at 300K (Ohm) | 5,600 |
| Thermal response time (msec) | 5 |
| Responsivity (V/W) | 17,000 |
| Noise (V) | 64 × 10 − 9 |
| D* (cm Hz1/2/W) | 4.3 × 109 |

Turning now to FIGS. 3-7, a method for fabricating the thermoelectric detector is illustrated.

With respect to FIG. 3, a preferred detector fabrication process implemented in a suitable MEMS process begins with either blank silicon wafer 200, or, in an alternative preferred embodiment, a wafer with readout integrated circuitry or ROIC (not shown) for the detector previously fabricated thereon in a separate series of semiconductor process steps. If a ROIC wafer is to be used, the circuitry thereon is preferably designed with a matching pattern of interface pads to the detector array. A preferred MEMS process is surface micro machining but reactive ion etching, deep reactive ion etching or other suitable MEMS processes may be used to fabricate the invention.

Prefabricated ROIC wafer circuitry may comprise one of many integrated circuit technologies available today, including CMOS or BiCMOS processes and others. The integration of the detector to the ROIC may be accomplished by wafer-bonding or by monolithic integration; however, the monolithic integration process characteristically result in somewhat higher performance due to lower electrical resistance and thermal conductance of the interconnections.

In FIG. 3, wafer 200 is first passivated with a dielectric passivation layer 210. If a ROIC wafer is used, passivation layer 210 would typically be present and vias defined in the passivation layer 210 to allow for electrical interconnection between the detector and the appropriate bond pads on the readout IC.

Next, a conductive layer 220 is deposited and patterned. Conductive layer 220 may be a metal (e.g., gold, aluminum) or doped semiconductor material (e.g., polysilicon, silicon carbide). Conductive layer 220 may preferably be defined so as to serve as the electrical interconnection and routing for the detector elements, as well as provide an optically reflective surface for the offset distance 33 quarter wave resonant cavity designed to enhance IR absorption by plate structure 5, here shown as 220'.

Following this step, a sacrificial layer 230 is deposited. Exemplar sacrificial layer materials include polyimide, oxide and nitride, dependant upon detector processing constraints. For integration with CMOS ROIC wafers, it is desirable that processing temperatures remain below 425° C. Polyimide has been successfully used as sacrificial layer for producing microbolometers over CMOS ROIC wafers. Other exemplar materials include sacrificial polymers (such as Unity 2203P or 46908P marketed by Promerus) that sublimates at elevated temperatures. If an oxide or nitride is used as the sacrificial layer, a wet etching process would be required which is less desirable as the suspended plate structures 5 are fragile and may not withstand forces imparted by the wet etching process. The thickness of sacrificial layer 230 is controlled to yield a gap that defines a resultant optical resonant cavity, i.e., offset distance 33.

A preferred design for high absorption of mid (3-5 μm) and long wave (8-12 μm) infrared is an offset distance of approximately 2 microns. After depositing sacrificial layer 230, a chemical-mechanical polishing (CMP) process is preferably used to planarize the surface to prevent unwanted surface contour defects from transferring to the final detector structure.

The support for plate structure 5 is fabricated next, as shown in FIG. 4. In the MEMS embodiment, plate structure 5 is desirably thin (<250 nm), and low stress to avoid deformation or breakage. Exemplar plate structure materials include polysilicon, silicon nitride, silicon carbide, or a multi-layer structure comprise of the above. Near-zero stress films can be deposited by controlling the deposition temperature and vacuum level. Alternatively, a warpage-free structure may be fabricated using multi-layer, stress-balanced structures which leverage the thermal expansion characteristics of different materials. For example, a sandwich structure of nitride-oxide-nitride may be used to balance the large thermal expansion of nitride ($30 \times 10^{-6}/°$ C. compare to $7 \times 10^{-6}/°$ C. for oxide) to yield a composite structure that is relatively free of warpage. This construction further allows nitride deposition in a very thin layer on the surface of plate structure 5, preventing impurity diffusion and ionic contamination.

After deposition, the plate structure layer is patterned to separate the individual detectors on the wafer. Additional access holes may also be patterned on the plate structure to enable a gaseous etchant to more efficiently remove the sacrificial material in a subsequent step.

Making electrical connections between the detectors and readout circuits requires fabricating one or more the blind vias 240. This is accomplished by etching openings on sacrificial layer 230 as shown in FIG. 5.

With vias 240 opened, the electrical connection of the detector elements may be made as shown in FIG. 6. Selected thin-film positively doped and negatively doped thermoelectric materials 250 and 260 are deposited over sacrificial layer 230, forming the structures that will become thermoelectric structures 20 and 25, as well making electrical connections through vias 240.

Two types of thermoelectric thin-films (n- and p-doped) are preferably deposited to form the thermoelectric structures. Examples of thermoelectric thin-films that have been successfully demonstrated include Bi0.4-Sb1.6Te3.3 (p-type) and Bi1.6-Sb0.4-Te3.3 (n-type). To enhance the adhesion of Bi—Sb—Te, an adhesion promoter material such as Titanium may be used.

The thermoelectric structures are patterned by etching the deposited thermoelectric layer or through a lift-off process.

A thin layer (e.g., less than 50 angstrom) of infrared absorbing material 60 such as platinum, IR absorbing dye or equivalent material may be deposited and patterned over the support structure using one of several well-defined lithography processes.

The final wafer processing, illustrated in FIG. 7, involves removing a predetermined portion of sacrificial material 230 to define the thermoelectric structures and plate structure suspended over reflective surface 220'. Depending on the material used to manufacture the sacrificial oxides, the etch process would be different. For instance, a polyimide sacrificial layer is typically removed using a dry oxygen plasma etch. Alternatively, where a degenerative polymer is used, the sacrificial material is sublimated upon exposure to a specific temperature, but in either method, the removal of the sacrificial layer leaves an open air gap to define offset distance 33.

To protect the detector array from environmental contamination, the wafer may capped by bonding with another wafer. The capping wafers are etched to define cavities that form the window in front of the detector array. Typical window materials used in infrared applications include silicon and germanium materials. The bonding of the capping wafer may be accomplished by one of many wafer bonding techniques, including fusion, metal, glass-frit, and others.

The bonding process is preferably performed in a vacuum environment. For certain applications, the detector cavity may also contain gas absorbent materials (getter) that helps to maintain the vacuum condition over extended time.

Each detector array is individually sealed in its own vacuum cavity. Electrical connections are made through buried conductors under the seal or through contact pads on the prefabricated CMOS circuitry. The wafer is diced to separate the detector arrays for packaging.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. A thermoelectric detector device comprising:
   a plate structure coupled to at least one thermoelectric structure at a hot junction; and
   a substrate coupled to the at least one thermoelectric structure at a cold junction;
   wherein the plate structure is parallel to and offset from the substrate by a first distance, and wherein the at least one thermoelectric structure is adjacent to at least two edges of the plate structure.

2. The device of claim 1, wherein the at least one thermoelectric structure comprises at least one of bismuth-telluride, antimony-telluride, lead telluride, polysilicon, germanium, skutterudite, a nano-composite material, and a super-lattice structure.

3. The device of claim 1, wherein the plate structure comprises an infrared-absorbing material.

4. The device of claim 1, wherein the substrate comprises a reflector.

5. The device of claim 1, wherein the first distance is substantially a quarter wavelength of a pre-selected detector wavelength, and wherein the plate structure and the substrate are configured to act as a quarter-wave resonant cavity.

6. The device of claim 1, wherein the substrate comprises an integrated circuit electrically connected to the at least one thermoelectric structure.

7. The device of claim 1, further comprising a vacuum enclosure coupled to the substrate to thereby enclose the plate structure.

8. The device of claim 7, wherein the vacuum enclosure further comprises gas-absorbing materials.

9. The device of claim 1, wherein the at least one thermoelectric structure comprises two legs that are substantially orthogonal to each other.

10. The device of claim 1, wherein:
    the at least one thermoelectric structure comprises first and second thermoelectric structures;
    the first thermoelectric structure is coupled to the plate structure at the hot junction and to the substrate at the cold junction;
    the second thermoelectric structure is coupled to the plate structure at another hot junction and to the substrate at another cold junction; and
    the first thermoelectric structure is electrically connected to the second thermoelectric structure between the hot junction and the other hot junction.

11. The device of claim 10, wherein the first thermoelectric structure comprises a p-type semiconductor and the second thermoelectric structure comprises an n-type semiconductor.

12. A thermoelectric detector array comprising:
    a plurality of thermoelectric structures coupled to a substrate, wherein each thermoelectric structure is coupled to the substrate at a cold junction; and
    a plurality of plate structures, wherein each plate structure is coupled to at least one of the plurality of thermoelectric structures at a hot junction and is parallel to and offset from the substrate by a distance;
    wherein each thermoelectric structure comprises two legs that are substantially orthogonal to each other.

13. The thermoelectric detector array of claim 12, wherein the plurality of thermoelectric structures comprise at least one of bismuth-telluride, antimony-telluride, lead telluride, polysilicon, germanium, skutterudite, a nano-composite material, and a super-lattice structure.

14. The thermoelectric detector array of claim 12, wherein:
    each of the plurality of plate structures comprises an infrared-absorbing material;
    the substrate comprises a plurality of reflectors;
    the distance is substantially a quarter wavelength of a pre-selected detector wavelength; and
    each plate structure is paired with one of the plurality of reflectors and configured to act as a quarter-wave resonant cavity.

15. The thermoelectric detector array of claim 12, wherein the substrate comprises an integrated circuit electrically connected to each of the plurality of thermoelectric structures and configured to individually detect an amount of radiation incident on each of the plurality of plate structures.

16. The thermoelectric detector array of claim 12, further comprising at least one vacuum enclosure coupled to the substrate to thereby enclose the plate structures, wherein the vacuum enclosure further comprises gas absorbing materials.

17. The thermoelectric detector array of claim 12, wherein each thermoelectric structure is disposed beside at least two edges of one of the plurality of plate structures.

18. The thermoelectric detector array of claim 12, wherein:
    the plurality of thermoelectric structures comprises first and second thermoelectric structures;
    each of the plurality of plate structures is coupled to the first thermoelectric structure at the hot junction and to the second thermoelectric structure at another hot junction; and
    the first thermoelectric structure is electrically connected to the second thermoelectric structure between the hot junction and the other hot junction.

19. The thermoelectric detector array of claim 18, wherein the first thermoelectric structure comprises a p-type semiconductor and the second thermoelectric structure comprises an n-type semiconductor.

20. A method of making a thermoelectric detector, the method comprising:
    forming a sacrificial layer on a substrate;
    forming a plate structure on the sacrificial layer;
    forming at least one thermoelectric structure on the sacrificial layer; and
    removing the sacrificial layer;
    wherein a first end of the at least one thermoelectric structure is coupled to the plate structure and a second end of the at least one thermoelectric structure is coupled to the substrate, wherein the plate structure is parallel to and offset from the substrate by a first distance, and wherein the at least one thermoelectric structure is configured to at least partially encircle a perimeter of the plate structure.

21. The method of claim 20, wherein a portion of the at least one thermoelectric structure is located on a first edge of the plate structure.

22. The method of claim 20, wherein at least a portion of the at least one thermoelectric structure is located on a second edge of the plate structure.

23. The method of claim 20, further comprising forming at least one blind via through the sacrificial layer for the at least one thermoelectric structure.

24. The method of claim 23, further comprising forming an adhesion promoter in the at least one blind via.

25. The method of claim 20, wherein the at least one thermoelectric structure comprises at least one of bismuth-telluride, antimony-telluride, lead telluride, polysilicon, germanium, skutterudite, a nano-composite material, and a super-lattice structure.

26. The method of claim 20, further comprising forming an infrared-absorbing material on the plate structure.

27. The method of claim 20, further comprising forming a passivation layer and a reflector on the substrate.

28. The method of claim 20, wherein the sacrificial layer is a sublimating polymer.

29. The method of claim 20, wherein said forming at least one thermoelectric structure comprises forming a first thermoelectric structure comprising a p-type semiconductor and forming a second thermoelectric structure comprising an n-type semiconductor.

30. The method of claim 20, further comprising forming a multi-layer support layer for supporting the plate structure.

31. The method of claim 20, wherein the at least one thermoelectric structure is disposed adjacent to at least two edges of the plate structure.

* * * * *